US008422594B2

(12) United States Patent
Kargl et al.

(10) Patent No.: US 8,422,594 B2
(45) Date of Patent: Apr. 16, 2013

(54) CIRCUIT FOR DEMODULATING A PHASE MODULATED SIGNAL

(75) Inventors: Walter Kargl, Graz (AT); Markus Auer, Graz (AT); Albert Missoni, Graz (AT)

(73) Assignee: Infineon Technologies AG, Neubiberg (DE)

( * ) Notice: Subject to any disclaimer, the term of this patent is extended or adjusted under 35 U.S.C. 154(b) by 783 days.

(21) Appl. No.: 12/471,864

(22) Filed: May 26, 2009

(65) Prior Publication Data

US 2010/0303173 A1    Dec. 2, 2010

(51) Int. Cl.
*H04L 27/00*    (2006.01)
(52) U.S. Cl.
USPC .......................................................... 375/326
(58) Field of Classification Search .................. 375/287, 375/324, 322, 330, 340, 341
See application file for complete search history.

(56) References Cited

U.S. PATENT DOCUMENTS

| 3,934,205 | A  | * | 1/1976 | Bogert ........................... 375/327 |
| 2005/0226357 | A1 | * | 10/2005 | Yoshimura ..................... 375/376 |
| 2008/0267331 | A1 |  | 10/2008 | Littlechild et al. |
| 2011/0122977 | A1 | * | 5/2011 | Ludwig ......................... 375/346 |

OTHER PUBLICATIONS

Auer, et al., "Design and development of a mixed signal prototyping system to achieve very high data rates for contactless applications", Elektrotechnik & Informationstechnik, pp. 138-142 XP-002690016 (2008).
Auer, et al., "HF RFID Transponder with Phase Demodulator for Very High Bit-Rates up to 13.56 MBIT/s", IEEE RFID, pp. 69-76 (2010).
French Patent Office, Preliminary Search Report dated Jan. 11, 2013.

* cited by examiner

*Primary Examiner* — David C. Payne
*Assistant Examiner* — Wednel Cadeau
(74) *Attorney, Agent, or Firm* — Schiff Hardin LLP

(57) ABSTRACT

A demodulator is provided for demodulating a phase-modulated data signal. The demodulator includes a phase frequency detector to output a voltage representing a phase difference between a received phase-modulated data signal and a reference clock signal. The voltage is input to first and second phase change detectors, which are provided to measure the phase difference of the phase-modulated data signal during first and second time periods, respectively.

21 Claims, 7 Drawing Sheets

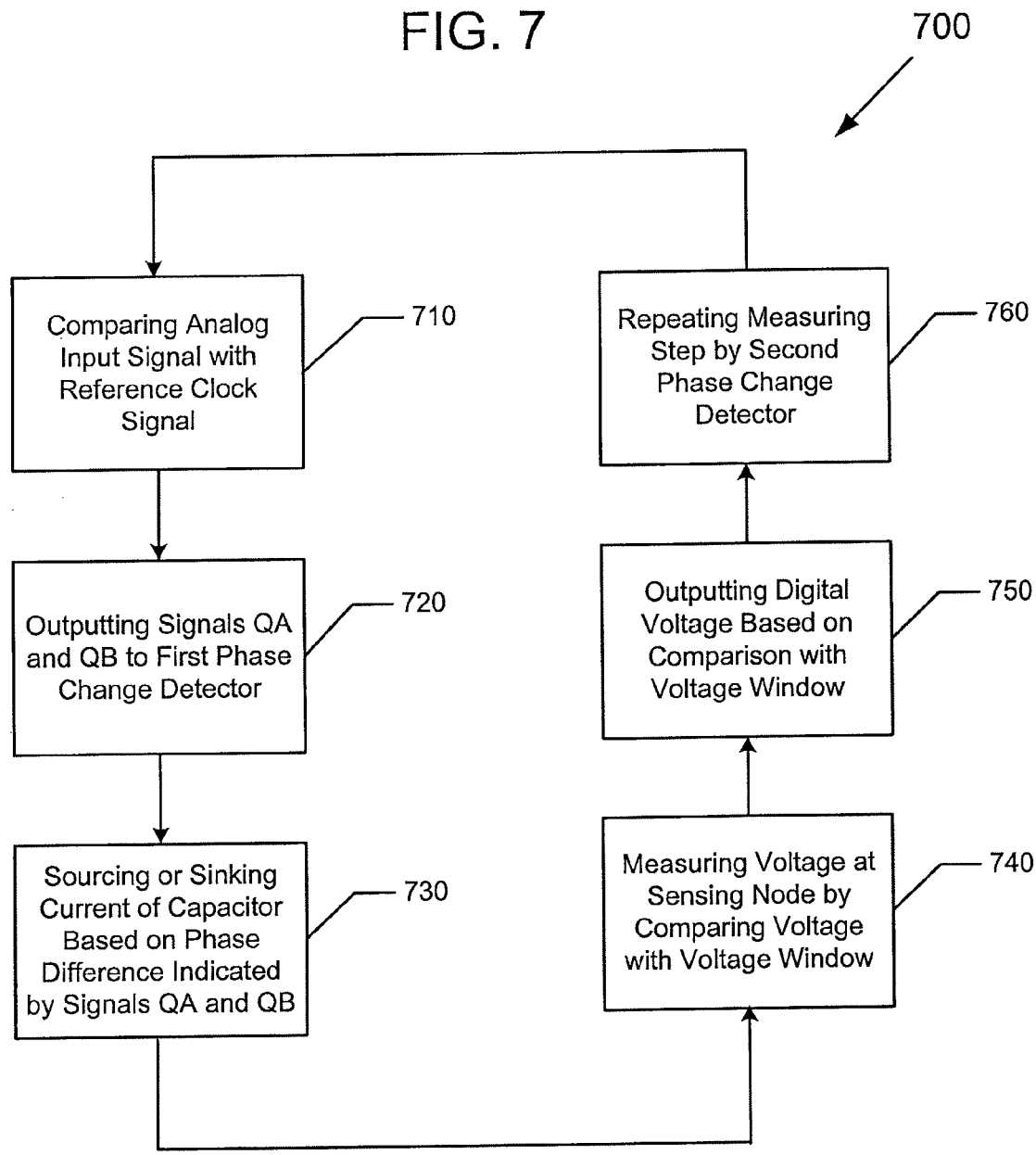

CIRCUIT FOR DEMODULATING A PHASE MODULATED SIGNAL

BACKGROUND

Phase modulation is a method of modulating wireless data signals to represent information as variations in the instantaneous phase of a carrier wave. Conventionally, phase modulation has not been widely used since it requires more complex receiving hardware and since ambiguity problems have often arisen when determining whether, for example, the signal has changed phase by +180° or −180°. Instead, existing wireless communication systems often employ amplitude-shift keying (ASK), which is another modulation method that represents digital data as variations in the amplitude of a carrier wave. Generally, the maximum communication speed in these systems is approximately 848 kilobits per second and is typically done at ASK having 10% modulation index.

Currently, there are several investigations to improve communication speed using phase modulation with more than one bit of information coding. However, due to bandwidth limitations in existing systems, it is not possible to increase the frequency of 848 kilohertz, which is approximately 1.2 microseconds per bit. As such, investigations involving phase modulation have attempted to modulate more than one bit of information during a given period. Certain techniques such as phase jitter modulation have attempted to utilize the advantages provided by phase modulation. However, conventional methods do not detect multiple phase angles and require a period of downtime for the detection circuit to recalibrate before being ready to receive further data on the phase-modulated signal.

BRIEF DESCRIPTION OF THE DRAWINGS

FIG. 7 illustrates a flowchart for a method for demodulating a phase-modulated data signal in accordance with an exemplary embodiment.

DETAILED DESCRIPTION

The present application is directed to a demodulation circuit for a phase-modulated data signal. More specifically, the application is directed to a demodulation circuit comprising a pair of phase change detectors each configured to measure the phase difference between a phase-modulated data signal and a reference signal at different time periods.

Figure 1:
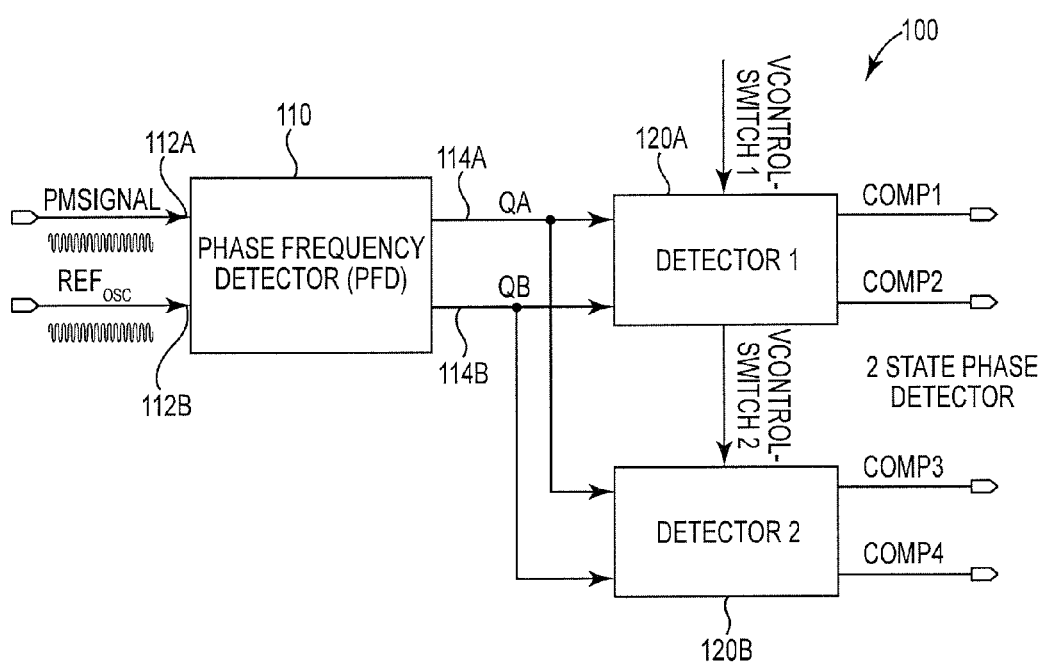
FIG. 1 illustrates a block diagram of a demodulation circuit in accordance with an exemplary embodiment.

FIG. 1 illustrates a block diagram of the demodulation circuit in accordance with an exemplary embodiment. It is noted that the demodulation circuit described in this application may be employed with any wireless electronic device capable of receiving phase-modulated data signals. As will be described below, demodulation circuit 100 is provided to measure the phase change of the modulated signal at multiple phase angles, thereby resulting in the ability to communicate data at faster transmission rates.

As shown, demodulation circuit 100 comprises phase frequency detector 110 and a pair of phase change detectors 120A, 120B. Each phase change detectors 120A, 120B is configured to operate in two states: a voltage initialization/calibration state and a measurement/detection state. Furthermore, phase frequency detector 110 includes two inputs 112A, 112B that are provided to receive an analog input signal $PM_{signal}$ and a reference clock signal $Ref_{osc}$. It is noted that phase frequency detectors are known in the art, and, therefore, the internal circuitry of phase frequency detector 110 is not described so as not to unnecessarily obscure aspects of the application. However, it should be understood that analog input signal $PM_{signal}$ is a phase-modulated data signal wirelessly transmitted from an external source and reference clock signal $Ref_{osc}$ can be generated by a local oscillator such as an LC oscillator, a ring oscillator or the like. Phase frequency detector 110 further includes two outputs 114A, 114B that are provided to output two data signals QA and QB, respectively. As will be discussed below, these data signals QA and QB indicate a difference in phase between analog input signal $PM_{signal}$ and reference clock signal $Ref_{osc}$.

As further shown, data signals QA and QB are input to both phase change detectors 120A, 120B. Using these data signals QA and QB, phase change detectors 120A, 120B are configured to measure the phase change of analog input signal $PM_{signal}$ and further configured to output a binary signal, which can be processed to determine the baseband data of the modulated analog input signal $PM_{signal}$. In particular, phase change detector 120A comprises outputs Comp1 and Comp2 and phase change detector 120B comprises outputs Comp3 and Comp4. Each of the outputs of each phase change detector 120A, 120B, such as outputs Comp1 and Comp1, are configured to output a digital bit (i.e., a "0" or a "1"). These data bits are then transmitted to a processing component of the wireless electronic device. For example, the processing component may be the wireless device's codec, which is capable of decoding the digital data signal and processing this signal accordingly.

In addition, as shown in FIG. 1, phase change detectors 120A, 120B are controlled by the digital control signals $V_{controlswitch1}$ and $V_{controlswitch2}$, respectively. These control signals serve as a digital logic for the phase change detectors 120A, 120B and are applied such that the detectors operate in an anti-cyclic sequence. Specifically, a digital state machine (not shown) may provide a control signal to the respective detectors such that phase change detector 120A will operate in a first state while phase change detector 120B will concurrently operate in a second state, and vice versa. As will be described in detail below, the first state may serve as a voltage initialization/calibration state while the second state may be the actual measurement/detection state.

Furthermore, in the exemplary embodiment, the wireless device stores data defining the bit rate and bit time of the communication system's data signal. A start condition can be executed to establish the anti-cyclic sequence provided by the digital state machine. For instance, a strong phase modulation will be applied to the analog input signal such that the digital state machine synchronizes with the timing of the data bits. Effectively, the digital state machine defines the operating states of phase change detectors 120A and 120B via control signals $V_{controlswitch1}$ and $V_{controlswitch2}$, using this synchronization information.

Figure 2:
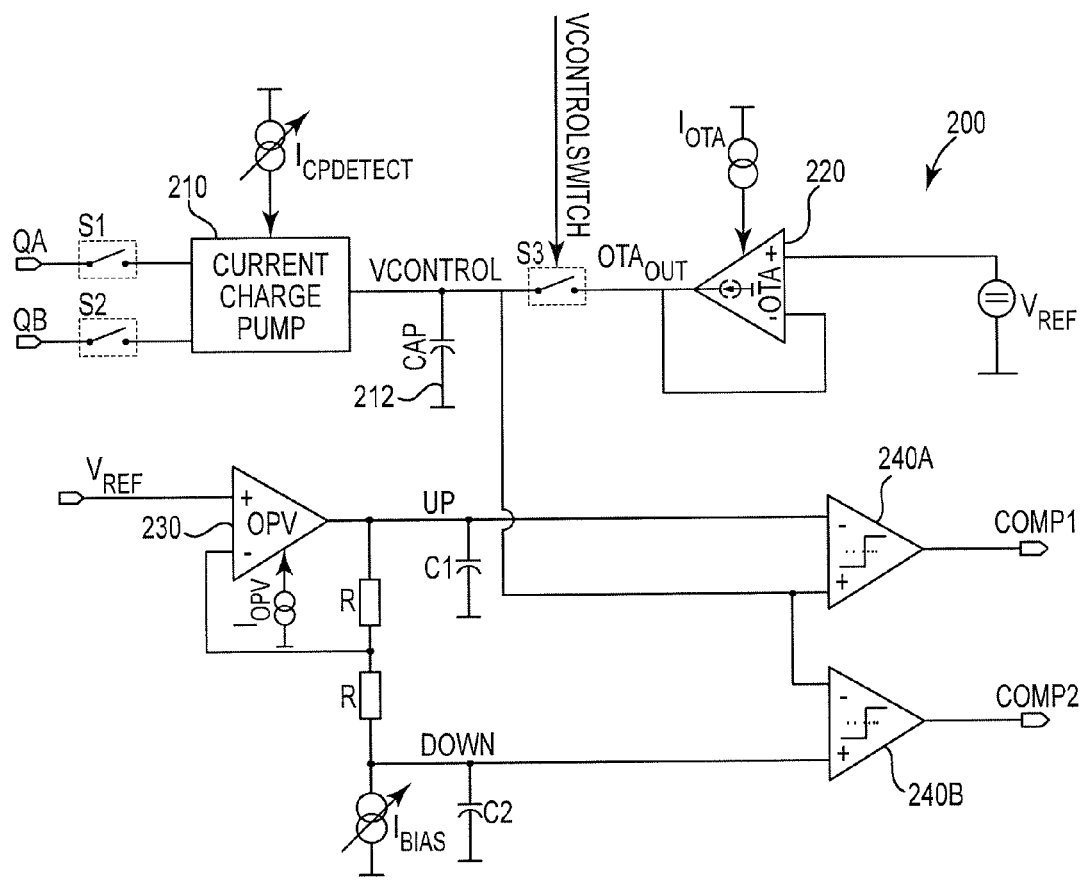
FIG. 2 illustrates a circuit diagram of a phase change detector in accordance with an exemplary embodiment.

FIG. 2 illustrates a circuit diagram of the phase change detector in accordance with an exemplary embodiment. It should be clear that phase change detector circuit 200 illustrates an exemplary embodiment for either of phase change detectors 120A or 120B as described above with respect to FIG. 1.

Phase change detector 200 comprises two inputs that are provided to receive data signals QA and QB, which are output by phase frequency detector 110 as described above. As shown, data signals QA and QB are fed into current charge pump 210, which is driven by source current $I_{CPDETECT}$. Furthermore, the output of current charge pump 210 is coupled to sensing node $V_{control}$. Capacitor 212 is positioned between sensing node $V_{control}$ and ground, and switch $S_3$ is coupled between sensing node $V_{control}$ and a buffer stage. The buffer stage comprises operational transconductance amplifier ("OTA") 220, which is driven by source current $I_{OTA}$ and reference voltage $V_{REF}$. OTA 220 is provided to drive the voltage at sensing node $V_{control}$ during the voltage initialization/calibration state. As should be clear, OTA 220 is provided to output a current $OTA_{OUT}$ that charges capacitor 212 when switch $S_3$ is closed. Effectively, when phase change detector 200 is in the voltage initialization/calibration state, the voltage at node $V_{control}$ is driven approximately to reference voltage $V_{REF}$. Alternatively, when switch $S_3$ is open, phase change detector 200 operates in the measurement/detection phase. As should be appreciated, switch $S_3$ is controlled by the digital control signal applied by the digital state machine (i.e., $V_{controlswitch1}$ for detector 120A and $V_{controlswitch2}$ for detector 120B).

In the exemplary embodiment, phase change detector 200 further comprises switches $S_1$ and $S_2$ that are positioned at the respective inputs of current charge pump 210. Switches $S_1$ and $S_2$ can further be driven by the digital state machine by a control signal. Thus, when switch $S_3$ is closed, effectively placing phase change detector 200 in the voltage initialization/calibration state, a control signal is applied by the digital state machine to open switches $S_1$ and $S_2$. As a result, the voltage at sensing node $V_{control}$ is not influenced by any potential output current of current charge pump 210.

In an alternative embodiment, however, switches $S_1$ and $S_2$ are not utilized since the output current of current charge pump 210 is much smaller than that of output current $OTA_{OUT}$. As such, even if phase change detector 200 does not employ switches $S_1$ and $S_2$, the voltage at sensing node $V_{control}$ will nevertheless be driven to reference voltage $V_{REF}$ while in the voltage initialization/calibration state, as long a switch $S_3$ is closed.

Phase change detector 200 further comprises operational amplifier 230 and a current source $I_{bias}$. Operational amplifier 230 is provided to define a voltage window in which the voltage at sensing node $V_{control}$ can be compared. In the exemplary embodiment, voltage reference $V_{REF}$ is coupled to the non-inverting input of operational amplifier 230, and a feedback loop defined by resistors R is coupled to the inverting input of operational amplifier 230. Moreover, source current $I_{OPV}$ is provided to operation amplifier 230. Furthermore, capacitors C1 and C2 are charged to establish the upper and lower voltage thresholds defining the voltage window. More particularly, the voltage at node UP defines the upper voltage threshold, and the voltage at node DOWN defines the lower voltage threshold. In this embodiment, the window size (i.e., voltage UP and voltage DOWN) is defined by $+/-R \times I_{bias}$. It should be clear that the circuit designer can therefore define the sensitivity of the voltage window based on the resistance value R and current bias value $I_{bias}$.

In an alternative embodiment, the voltage applied to the non-inverting input of operational amplifier 230 is defined by the voltage at the output node of transconductance amplifier 220. In yet another exemplary embodiment, the voltage applied to the non-inverting input of operational amplifier 230 is defined by the voltage at sensing node $V_{control}$. Each of these embodiments can be based on the preference of the circuit designer to vary measurement sensitivity and accuracy of the phase difference of analog input signal $PM_{signal}$. In a further embodiment, operational amplifier 230 is not provided, rather the voltage window is defined using a voltage divider comprising resistors or the like.

As further shown, voltage UP is input to the inverting input of comparator 240A, and voltage DOWN is input to the non-inverting input of comparator 240B. Furthermore, non-inverting input of comparator 240A and inverting input of comparator 240B are both coupled to sensing node $V_{control}$. Thus, as will be explained in detail below, when the voltage at sensing node $V_{control}$ becomes greater than voltage UP, comparator 240A will output a high signal represented by a digital "1". Alternatively, when the voltage at sensing node $V_{control}$ becomes less than voltage DOWN, comparator 240B will output a high signal represented by a digital "1". Otherwise, both comparators 240A and 240B will output digital "0's" indicating that voltage at sensing node $V_{control}$ is within the voltage window.

Figure 3:
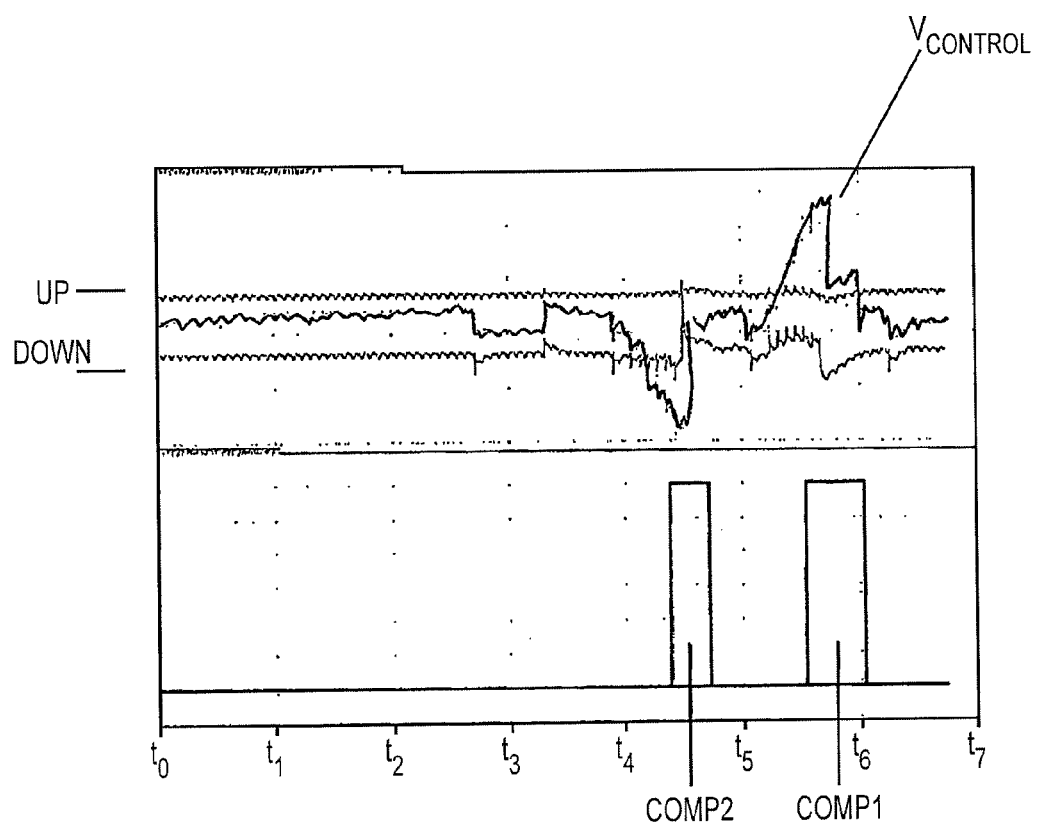
FIG. 3 shows a voltage diagram illustrating the operation of a phase change detector in an exemplary embodiment.

FIG. 3 shows a voltage diagram illustrating the operation of phase change detector 200 in an exemplary embodiment. In particular, FIG. 3 illustrates the operation of phase change detector 200 when switch $S_3$ is open and the detector is therefore operating in the measurement/detection state. Specifically, the voltage window is defined by voltage UP and voltage DOWN, and the voltage at sensing node $V_{control}$ is compared against these two threshold voltages for a time period $t_0$ through $t_7$. The y-axis therefore defines the voltage of the voltage window and voltage at sensing node $V_{control}$. It should be understood that the actual voltage for these components is based on the circuit designer implementation.

As discussed above, when phase change detector 200 is in the measurement/detection state, the voltage at sensing node $V_{control}$ is driven by current charge pump 210. Furthermore, the input signals QA and QB of current charge pump 210 indicate a phase shift of the phase-modulated analog input signal. These input signals are in turn used to control internal switches of current charge pump 210 to source or sink current into or out of capacitor 212. Specifically, the phase angle defined by input signals QA and QB is linearly converted to a voltage without signal distortion to source or sink the current of capacitor 212. Effectively, the voltage at sensing node $V_{control}$ is increased or decreased accordingly.

In each cycle, the time during which the internal switch is turned on is proportional to the phase difference indicated by QA and QB. As such, the charge delivered is also dependent on the phase difference. It should be appreciated that by eliminating distortion by the phase to voltage conversion, each phase change detector is capable of detecting varying degrees of phase difference between analog input signal $PM_{signal}$ and voltage reference $V_{REF}$.

Referring back to FIG. 3, if QA and QB have the same synchronized sequence, the current sourced or sunk by current charge pump 210 remains constant, and, therefore, the voltage at sensing node $V_{control}$ also remains constant. Effectively, voltage $V_{control}$ remains within the voltage window defined by threshold voltages UP and DOWN. As a result, the output of both comparators 240A and 240B output a digital logic "0". This is shown between time $t_0$ and $t_4$ of FIG. 3.

However, once a phase difference is indicated by input signals QA and QB, current charge pump 210 accordingly sources or sinks the current to capacitor 212. As shown in FIG. 3, between time $t_4$ and $t_5$, when voltage $V_{control}$ falls below the lower voltage threshold of the voltage window, output Comp2 of comparator 240B outputs a digital "1". Furthermore, between time $t_5$ and $t_6$, when voltage $V_{control}$ exceeds the upper voltage threshold of the voltage window, output Comp1 of comparator 240A outputs a digital "1". As noted above, these digital outputs are then communicated to the codec component of the wireless device, which decodes and processes the digital data signal. It should further be appreciated that the width of the output signal Comp1 of comparator 240A is wider (i.e., longer in time) than that of the output signal Comp2 of comparator 240B. This exemplifies that the positive phase change detected by comparator 240A has a greater phase change in degrees than that detected by comparator 240B.

As described above, each phase change detector is configured to operate in two states: a voltage initialization/calibration state and a measurement/detection state. Moreover, the particular state is controlled by the control signals $V_{controlswitch1}$ and $V_{controlswitch2}$, respectively. It should further be appreciated that FIG. 3 illustrates a voltage diagram that serves as an example for either phase change detector 120A or phase change detector 120B.

Figure 4:
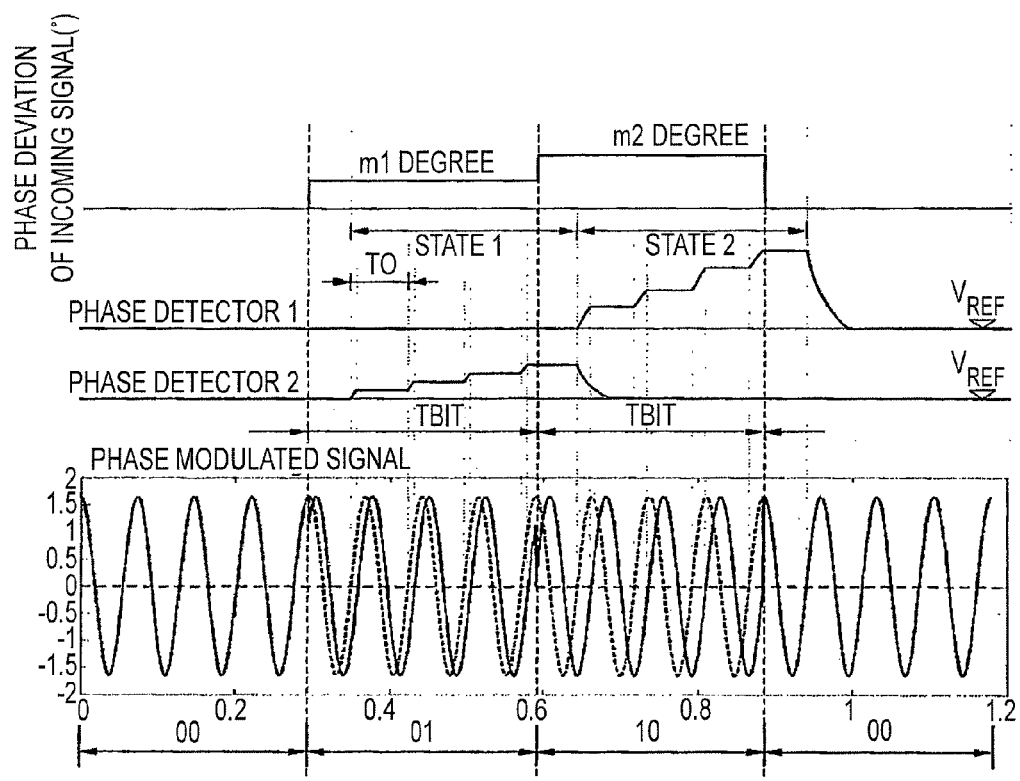
FIG. 4 illustrates a state sequence diagram for a pair of phase change detectors in accordance with an exemplary embodiment.

FIG. 4 illustrates a state sequence diagram for both phase change detectors 120A and 120B in accordance with an exemplary embodiment. In particular, the state sequence diagram illustrates a phase-modulated bit sequence 00 01 10 00. As shown, reference clock signal $Ref_{osc}$ is represented by a solid sine wave and analog input signal $PM_{signal}$ is represented by dashed sine wave. Furthermore, a phase deviation signal is illustrated, representing the amplitude of phase difference between reference clock signal $Ref_{osc}$ and analog input signal $PM_{signal}$. Finally, the sensing voltage of both voltage phase change detectors 120A and 120B is illustrated relative to reference voltage $V_{REF}$.

In operation, at initial bit 00, it should be clear that there is no phase difference between reference clock signal $Ref_{osc}$ and analog input signal $PM_{signal}$. When there is no phase difference, the sensing voltage $V_{control}$ of each phase change detector will be approximately equal to reference voltage $V_{REF}$ since current charge pump 210 will neither sourcing nor sinking capacitor 212. Next, at bit 01, a phase difference of m1 degrees between the two signals is illustrated for exemplary purposes. It is noted that in this example, the first phase change detector 120A is in the voltage initialization/calibration state while the second phase detector 120B is in the measurement/detection state. In particular, the digital logic of demodulation circuit 100 outputs control signal $V_{controlswitch1}$ to close the respective switch $S_3$ of phase change detector 120A (i.e., Phase Detector 1) while control signal $V_{controlswitch2}$ opens the respective switch $S_3$ of phase change detector 120B (i.e., Phase Detector 2). Accordingly, the sensing voltage $V_{control}$ of phase change detector 120A will be initialized to reference voltage $V_{REF}$. Concurrently, the internal sensing voltage $V_{control}$ of phase change detector 120B will be driven by the phase difference between reference clock signal $Ref_{osc}$ and analog input signal $PM_{signal}$. This sensing voltage $V_{control}$ will in turn be compared with the voltage window of phase change detector 120B as described above with respect to FIG. 3.

Subsequently, in this exemplary embodiment, the third bit of the sequence, i.e. bit "10", represents a phase difference of m2 degrees between reference clock signal $Ref_{osc}$ and analog input signal $PM_{signal}$. At this stage in the cycle, the first phase change detector 120A switches states with the second phase change detector 120B. Specifically, the digital logic of demodulation circuit 100 outputs control signal $V_{controlswitch1}$ to open the respective switch $S_3$ of phase change detector 120A while control signal $V_{controlswitch2}$ closes the respective switch $S_3$ of phase change detector 120B. Accordingly, the sensing voltage $V_{control}$ of phase change detector 120B will be recalibrated to reference voltage $V_{REF}$. Concurrently, phase change detector 120A will be switched to the measurement/detection state, and the internal sensing voltage $V_{control}$ will be driven by the phase difference between reference clock signal $Ref_{osc}$ and analog input signal $PM_{signal}$. This sensing voltage $V_{control}$ will similarly be compared with the voltage window of phase change detector 120A as described above with respect to FIG. 3.

It is noted that the exemplary phase difference between reference clock signal $Ref_{osc}$ and analog input signal $PM_{signal}$ for bit 10 is larger than that of bit 01. As such the phase deviation m2 is greater than the phase deviation m1. As should be clear, the amplitude of the phase deviation has a direct influence on the amplitude of the sensing voltage $V_{control}$ of both phase change detectors 120A and 120B. Due to a variation in the amplitude of the phase deviation, demodulation circuit 100 is effectively capable of measuring phase modulation of the analog input signal at multiple angles. Moreover, it should be appreciated that by employing two phase detectors in demodulation circuit 100, the data demodulation speed can be significantly faster than conventional phase-demodulation circuits since there is no initialization/calibration state in which demodulation circuit 100 of the instant application is unable to measure the phase-modulated data signal.

While the foregoing has been described in conjunction with an exemplary embodiment, it is understood that the term "exemplary" is merely meant as an example, rather than the best or optimal. Accordingly, the application is intended to cover alternatives, modifications and equivalents, which may be included within the spirit and scope of the application.

Figure 5:
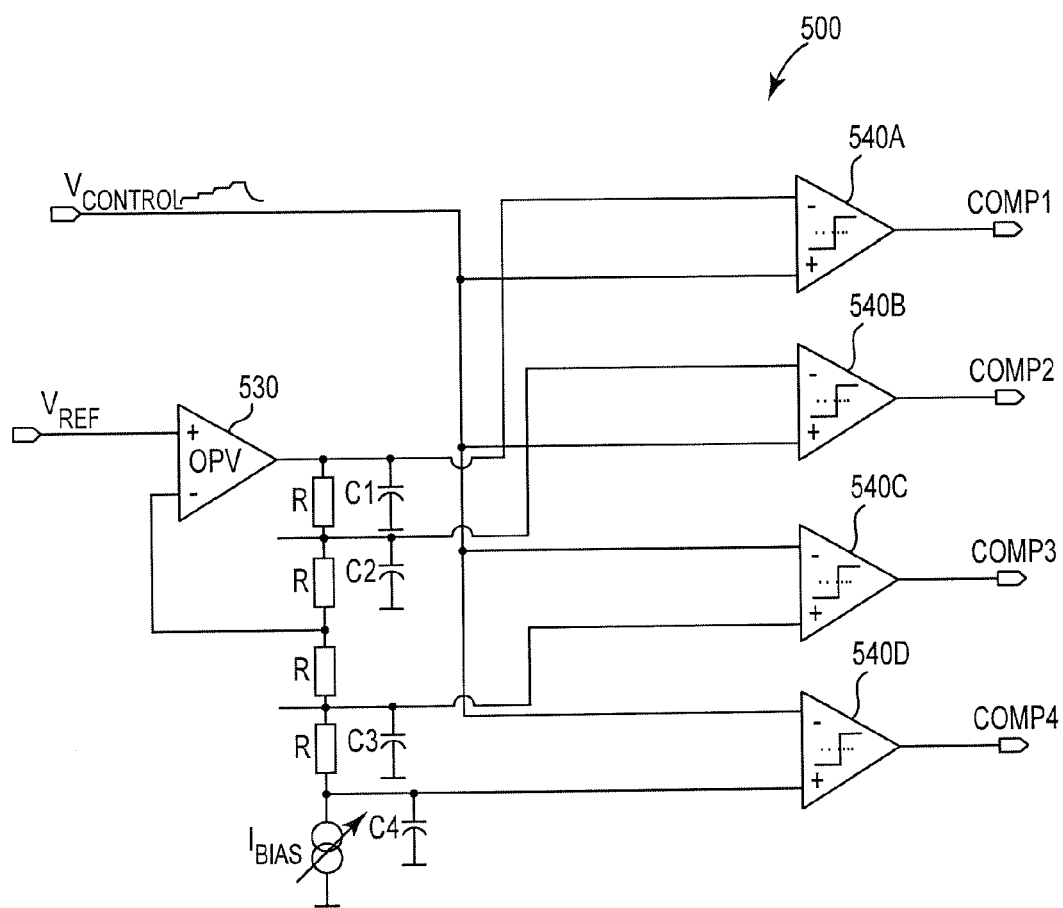
FIG. 5 illustrates a circuit diagram of a phase change detector in accordance with another exemplary embodiment.

For example, FIG. 5 illustrates a circuit diagram of a phase change detector in accordance with another exemplary embodiment. Generally, phase change detector 500 comprises many of the same components as those described above with respect to FIG. 2, including a current charge pump and buffer stage. Those features have not been illustrated in FIG. 5 so as to not unnecessarily obscure the differences between the two embodiments of the phase change detector. Rather, the voltage at sensing node $V_{control}$ is applied to the multiphase demodulating components illustrated in FIG. 5.

As shown, the comparator stage of phase change detector 500 comprises operational amplifier 530, current source $I_{bias}$, resistors R, and capacitors C1, C2, C3 and C4. Moreover, the voltage $V_{control}$ is compared with a first voltage window defined by comparators 540A and 540B, as well as a second voltage window defined by comparators 540C and 540D. The upper and lower voltages of these voltage windows will be defined by the resistance values R and current source $I_{bias}$. As should be appreciated that by applying multiple voltage windows against sensing voltage $V_{control}$, phase change detector 500 is capable of demodulating multiple phase differences of analog input signal $PM_{signal}$. Similar to phase change detector 200, the outputs Comp1 through Comp4 of comparators 540A through 540D, respectively, can be transmitted to the processing component of the wireless electronic device. Again, it is noted that the processing component may be the wireless device's codec, which is capable of decoding the digital data signal and utilizing this signal accordingly.

Figure 6:
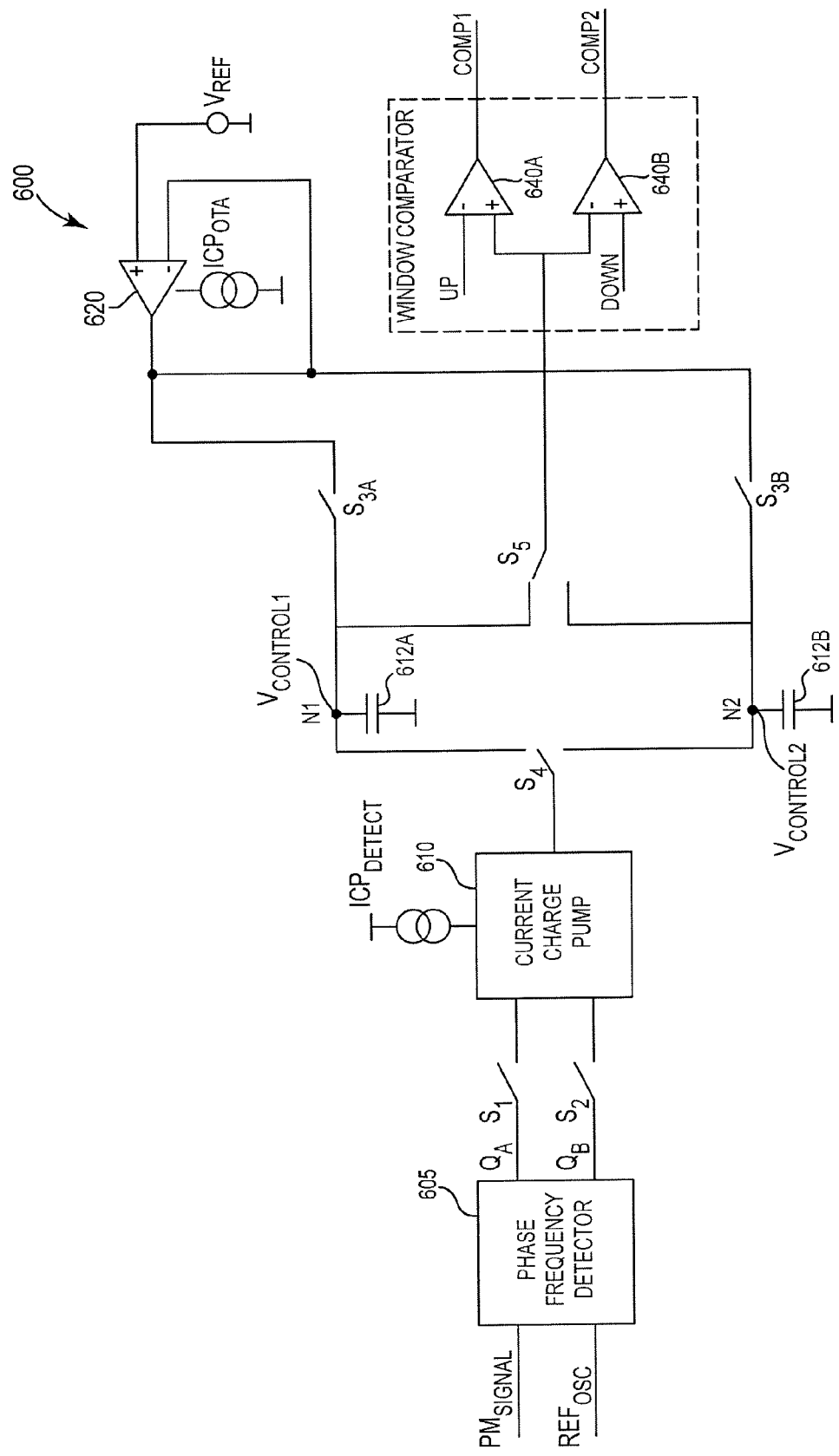
FIG. 6 illustrates a block diagram of a demodulation circuit in accordance with another exemplary embodiment.

Furthermore, FIG. 6 illustrates a block diagram of the demodulation circuit in accordance with another exemplary embodiment. In this embodiment, certain components of demodulation circuit 600 are used by both of the pair of phase change detectors by multiplexing a control signal $V_{controlswitch}$. Specifically, certain components such as the current charge pump, buffer stage and voltage window are utilized by both phase change detectors. It should be reiterated that FIG. 6 is shown for exemplary purposes. As such, alternative variations combining any one or more of these components, and which are within the scope of the application, are also contemplated.

As shown in FIG. 6, demodulation circuit 600 comprises a phase frequency detector 605 having two inputs that are provided to receive an analog input signal $PM_{signal}$ and a reference clock signal $Ref_{osc}$. Moreover, phase frequency detector 605 further includes two outputs that are provided to output two data signals QA and QB, respectively. As discussed above with respect to the foregoing figures, these data signals QA and QB indicate a difference in phase between analog input signal $PM_{signal}$ and reference clock signal $Ref_{osc}$.

As further shown, these data signals QA and QB are input to a single current charge pump 610, which is driven by source current $I_{CPDETECT}$. Switches $S_1$ and $S_2$ may be coupled between the inputs of current charge pump 610 and the outputs of the phase frequency detector. Furthermore, the output of current charge pump 610 is coupled to capacitors 612A and 612B, respectively. As shown, switch $S_4$, may be positioned between the output of current charge pump 610 and capacitors 612A and 612B. Sensing node $N_1$ and $N_2$ are provided between the respective current charge pumps and capacitors in which sensing voltages $V_{control1}$ and $V_{control2}$ can be measured. In this embodiment, signal $V_{controlswitch}$ will serve as a multiplexing signal at switch $S_4$ such that when $S_4$ is in a first position, the output of current charge pump 610 is coupled to sensing node $N_1$. Alternatively, when switch $S_4$ is in a second position, the output of current charge pump 610 is coupled to sensing node $N_2$.

Furthermore, each of the respective sensing nodes $N_1$ and $N_2$ may be coupled to the buffer stage via switches $S_{3A}$ and $S_{3B}$, respectively. The buffer stage comprises operational transconductance amplifier 620, which is driven by source current $I_{OTA}$ and reference voltage $V_{REF}$. It should be appreciated that in operation, a control signal $V_{controlswitch}$ is applied to the respective switches $S_{3A}$ and $S_{3B}$ such that they open and close in an anti-cyclic sequence. As a result, when $S_{3A}$ is closed and switch $S_4$ is in a second position, sensing voltage $V_{control1}$ at $N_1$ will be driven to reference voltage $V_{REF}$, thereby being placed in a voltage initialization/calibration state. Concurrently, control signal $V_{controlswitch}$ will open switch $S_{3B}$ and place switch $S_4$ in the second position, such that sensing voltage $V_{control2}$ at $N_2$ will be driven by the current output by current charge pump 610, which is controlled by any phase difference between analog input signal $PM_{signal}$ and reference clock signal $Ref_{osc}$. It is noted that control signal $V_{controlswitch}$ has not been shown in FIG. 6 so as to not unnecessarily obscure the aspects of this embodiment.

It should further be appreciated that in this embodiment, control signal $V_{controlswitch}$ will serve as a multiplexing signal at switch $S_5$. Thus, when switch $S_{3A}$ is open by control signal $V_{controlswitch}$, switch $S_5$ is placed in a first position such that sensing voltage $V_{control1}$ is applied to the voltage window. Alternatively, when switch $S_{3B}$ is open, switch $S_5$ is placed in a second position such that sensing voltage $V_{control2}$ is applied to the voltage window. The voltage window comprises comparators 640A and 640B and otherwise functions similarly to that described above with respect to FIG. 2. Therefore, the voltage at sensing nodes $V_{control1}$ and $V_{control2}$ is compared to a voltage window defined by upper and lower voltage thresholds UP and DOWN, respectively. Moreover, it should be clear, that such comparison is performed in an anti-cyclic sequence as defined by control signal $V_{controlswitch}$.

FIG. 7 illustrates a flowchart for a method for demodulating a phase-modulated data signal in accordance with an exemplary embodiment. It is noted that the following method is described with respect to the circuits illustrated in FIGS. 1 and 2. Of course, the method is in no way intended to be limited to these specific circuits. Instead, it should be appreciated that the method can be performed implementing any alternatives, modifications and equivalents, which may be included within the spirit and scope of the application.

Initially, in step 710, phase frequency detector 110 of demodulation circuit 100 receives an analog input signal $PM_{signal}$ and compares it with a reference clock signal $Ref_{osc}$. Next, at step 720, phase frequency detector 110 outputs a pair of signals QA and QB, which indicate any phase difference between analog input signal $PM_{signal}$ and reference clock signal $Ref_{osc}$. Signals QA and QB are then fed into current charge pump 210 of a first of two phase change detectors 120A, which sources or sinks the current applied to capacitor 212 based on the magnitude of phase deviation defined by signals QA and QB (step 730). Concurrently, the second of the two phase change detectors 120B is calibrated by reference voltage $V_{REF}$.

Next, at step 740, the first phase change detector 120A measures the voltage at sensing node $V_{control}$ of capacitor 212, by comparing this voltage, via comparators 240A and 240B, with a voltage window defined by voltages UP and DOWN. At step 750, comparators 240A and 240B each output a digital voltage based on the comparison. If the voltage at the sensing node $V_{control}$ exceed voltage UP or falls below voltage DOWN, comparator 240A or comparator 240B output a digital "1", respectively. Otherwise, if the voltage at sensing node $V_{control}$ is within the voltage window, both comparators 240A and 240B output a digital "0". These digital signals are subsequently processed by the codec components of the wireless device, which is utilizing demodulation circuit 100. Finally, at step 760, the measuring process is repeated by the second of the two phase change detectors 120B, while the first phase change detector 120A is concurrently calibrated by reference voltage $V_{REF}$. As discussed above, the state of the pair of phase change detector 120A and 120B is controlled by control signals $V_{controlswitch1}$ and $V_{controlswitch2}$, respectively.

In the preceding detailed description, numerous specific details have been set forth in order to provide a thorough understanding of the present invention. However, it should be apparent to one of ordinary skill in the art that the inventive demodulation circuit and method may be practiced without these specific details. In other instances, well-known methods, procedures, components, and circuits have not been described in detail so as not to unnecessarily obscure aspects of the application.

What is claimed is:

1. A demodulator for demodulating a phase-modulated data signal, comprising:
   a phase frequency detector configured to output a voltage representing a phase difference between the phase-modulated data signal and a reference clock signal;
   a first phase change detector coupled to the phase frequency detector, wherein the first phase change detector is configured to:
      measure as a first sensing voltage, during a first time period, the phase difference represented by the voltage; and
      initialize, during a second time period, the first sensing voltage to a reference voltage; and
   a second phase change detector coupled to the phase frequency detector, wherein the second phase change detector is configured to:

initialize, during the first time period, a second sensing voltage to the reference voltage; and measure as the second sensing voltage, during the second time period, the phase difference represented by the voltage.

2. The demodulator of claim 1, further comprising at least one current charge pump configured to adjust the respective first and second sensing voltages of the first and second phase change detectors based on the voltage representing the phase difference.

3. The demodulator of claim 2, wherein the respective first and second sensing voltages of the first and second phase change detectors are initialized by the reference voltage before the at least one current charge pump adjusts the respective first and second sensing voltages.

4. The demodulator of claim 2, wherein each of the first and second phase change detectors further comprises:
 a high threshold comparator configured to compare the respective first and second sensing voltages with a high threshold voltage; and
 a low threshold comparator configured to compare the respective first and second sensing voltages with a low threshold voltage.

5. The demodulator of claim 4, wherein the high and low threshold comparators are each configured to output a digital signal for processing by a codec of a wireless device.

6. The demodulator of claim 2, wherein each of the first and second phase change detectors further comprises a plurality of comparators each being configured to compare the respective first and second sensing voltages with a plurality of different threshold voltages, respectively.

7. The demodulator of claim 1, further comprising a digital state machine coupled to the first and second phase change detectors and configured to generate a control signal, which controls the amount of time for the first and the second time periods.

8. The demodulator of claim 7, wherein the digital state machine is configured to generate a control signal based on the bit rate of the phase-modulated data signal.

9. The demodulator of claim 2, further comprising:
 a high threshold comparator configured to compare the respective first and second sensing voltages of each of the first and second phase change detectors with a high threshold voltage;
 a low threshold comparator configured to compare the respective first and second sensing voltages of each of the first and second phase change detectors with a low threshold voltage; and
 an adjustable switch configured to couple each of the high and low threshold comparators to the first phase change detector during the first time period and to the second phase change detector during the second time period.

10. A method for demodulating a phase-modulated data signal, the method comprising:
 generating a voltage representing a phase difference between a phase-modulated data signal and a reference clock signal;
 measuring as a first sensing voltage, by a first phase change detector, the phase difference represented by the voltage during a first time period;
 measuring as a second sensing voltage, by a second phase change detector, the phase difference represented by the voltage during a second time period;
 initializing the first sensing voltage to a reference voltage in the first phase change detector during the second time period; and
 initializing the second sensing voltage to the reference voltage in the second phase change detector during the first time period.

11. The method of claim 10, further comprising adjusting the first and second sensing voltages, by at least one current charge pump, based on the voltage.

12. The method of claim 11, further comprising:
 comparing at least one of the first and second sensing voltages with a high threshold voltage;
 comparing the at least one of the first and second sensing voltages with a low threshold voltage; and
 outputting a digital signal indicating a phase change of the phase-modulated data signal if the at least one of the first and second sensing voltages exceeds the high threshold voltage or falls below the low threshold voltage.

13. The method of claim 11, further comprising comparing at least one of the first and second sensing voltages with a plurality of different threshold voltages.

14. The method of claim 11, further comprising initializing the respective first and second sensing voltages to the reference voltage prior to the adjusting.

15. The method of claim 10, further comprising adjusting the first and second sensing voltages, by respective current charge pumps of each of the first and the second phase change detectors, based on the voltage representing the phase difference,
 wherein each of the initializing steps comprises initializing the respective first and second sensing voltages to the reference voltage prior to the respective adjusting.

16. The method of claim 10, further comprising generating a control signal, by a digital state machine, which defines the amount of time for the first and the second time period.

17. The method of claim 16, wherein the control signal is based on the bit rate of the phase-modulated data signal.

18. The method of claim 12, further comprising processing the digital signal by a codec of a wireless device.

19. A demodulation circuit for demodulating a phase-modulated data signal, comprising:
 a phase frequency detection means for outputting a voltage representing a phase difference between the phase-modulated data signal and a reference clock signal;
 a first phase change detection means for measuring, as a first sensing voltage, during a first time period, the phase difference represented by the voltage, and initializing, during a second time period, the first sensing voltage to a reference voltage;
 a second phase change detection means for measuring, as a second sensing voltage, during a second time period, the phase difference represented by the voltage, and initializing, during the first time period, the second sensing voltage to the reference voltage.

20. The demodulation of claim 19, further comprising a current charge pump means for adjusting the respective first and second sensing voltages of each of the first and second phase change detection means based on the voltage representing the phase difference.

21. The demodulation circuit of claim 20, wherein each of the first and second phase change detection means further comprises:
 a high threshold comparison means for comparing the respective first or second sensing voltage with a high threshold voltage; and
 a low threshold comparison means for comparing the respective first or second sensing voltage with a low threshold voltage,
 wherein a digital signal indicating a phase change of the phase-modulated data signal is output if the respective first or second sensing voltage exceeds the high threshold voltage or falls below the low threshold voltage.

* * * * *